(12) United States Patent
Wu et al.

(10) Patent No.: US 12,114,478 B2
(45) Date of Patent: Oct. 8, 2024

(54) SEMICONDUCTOR STRUCTURE AND METHOD FOR PREPARING SAME

(71) Applicant: CHANGXIN MEMORY TECHNOLOGIES, INC., Hefei (CN)

(72) Inventors: Gongyi Wu, Hefei (CN); Yong Lu, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 489 days.

(21) Appl. No.: 17/444,085

(22) Filed: Jul. 30, 2021

(65) Prior Publication Data
US 2022/0059539 A1    Feb. 24, 2022

Related U.S. Application Data

(63) Continuation of application No. PCT/CN2021/096917, filed on May 28, 2021.

(30) Foreign Application Priority Data

Aug. 24, 2020 (CN) .......................... 202010855256.6

(51) Int. Cl.
*H10B 12/00* (2023.01)
*H01L 29/06* (2006.01)

(52) U.S. Cl.
CPC ......... *H10B 12/30* (2023.02); *H01L 29/0649* (2013.01); *H10B 12/488* (2023.02)

(58) Field of Classification Search
CPC ............. H01L 29/1037; H01L 29/4236; H01L 29/0649; H10B 12/053; H10B 12/34; H10B 12/00; H10B 12/30; H10B 12/488
See application file for complete search history.

(56) References Cited

U.S. PATENT DOCUMENTS

| 6,365,933 B1 * | 4/2002 | Yamazaki | ............... H01L 29/04 |
| | | | 257/E27.111 |
| 6,441,421 B1 * | 8/2002 | Clevenger | .............. H10B 12/03 |
| | | | 257/E21.654 |

(Continued)

FOREIGN PATENT DOCUMENTS

| CN | 101777557 A | 7/2010 |
| CN | 103208452 A | 7/2013 |

(Continued)

OTHER PUBLICATIONS

Supplementary European Search Report in the European application No. 21859740.9, mailed on Jan. 5, 2024. 7 pages.

*Primary Examiner* — Michelle Mandala
*Assistant Examiner* — Kevin Quinto
(74) *Attorney, Agent, or Firm* — Syncoda LLC; Feng Ma

(57) ABSTRACT

A method for preparing a semiconductor structure includes: providing a semiconductor substrate; forming a groove in the semiconductor substrate; forming a first insulation layer, the first insulation layer at least covering an inner wall of the groove; forming a channel layer, the channel layer at least covering an inner wall of the first insulation layer; forming a second insulation layer, the second insulation layer at least covering an inner wall of the channel layer; filling the groove with a word line structure; removing part of the semiconductor substrate, part of the first insulation layer, and part of the channel layer, and forming a recess region in an outer side wall of the second insulation layer; and forming a source-drain in the recess region, the source-drain being electrically connected with the channel layer.

17 Claims, 14 Drawing Sheets

(56) References Cited

U.S. PATENT DOCUMENTS

| | | |
|---|---|---|
| 7,790,551 B2 | 9/2010 | Rouh |
| 2007/0120182 A1 | 5/2007 | Rouh |
| 2008/0057649 A1* | 3/2008 | Schuele ............ H01L 29/78627 |
| | | 257/E21.429 |
| 2010/0041196 A1 | 2/2010 | Rouh |
| 2017/0323948 A1 | 11/2017 | Basker |
| 2020/0111899 A1 | 4/2020 | Zhang |

FOREIGN PATENT DOCUMENTS

| | | |
|---|---|---|
| CN | 103681856 A | 3/2014 |
| CN | 108063140 A | 5/2018 |
| CN | 108110005 A | 6/2018 |
| CN | 110890428 A | 3/2020 |
| CN | 110911407 A | 3/2020 |

\* cited by examiner

SEMICONDUCTOR STRUCTURE AND METHOD FOR PREPARING SAME

CROSS-REFERENCE TO RELATED APPLICATIONS

This application is a continuation of International Application No. PCT/CN2021/096917 filed on May 28, 2021, which claims priority to Chinese Patent Application No. 202010855256.6 filed on Aug. 24, 2020. The disclosures of these applications are hereby incorporated by reference in their entirety.

BACKGROUND

A dynamic random-access memory (DRAM) is a commonly used semiconductor device in an electronic device such as a computer. DRAM consists of a memory cell array used to store data and a peripheral circuit located around the memory cell array. Each memory cell generally includes a transistor and a capacitor. can control the turning on and off of the transistor can be controlled by a word line voltage of the transistor, so that data information stored in the capacitor can be read through a bit line, or the data information can be written into the capacitor.

SUMMARY

This disclosure relates generally to the field of semiconductor manufacturing, and more specifically to a semiconductor structure and a method for preparing the same.

Various embodiments of the disclosure provide a semiconductor structure and a method for preparing the same. The substrate leakage current can be avoided and the reliability of the semiconductor structure can be improved.

In an aspect, the disclosure provides a method for preparing a semiconductor structure. The method includes the following operations. A semiconductor substrate is provided. A groove is formed in the semiconductor substrate. A first insulation layer is formed and the first insulation layer at least covers an inner wall of the groove. A channel layer is formed and the channel layer at least covers an inner wall of the first insulation layer. A second insulation layer is formed and the second insulation layer at least covers an inner wall of the channel layer. The groove is filled with a word line structure. Part of the semiconductor substrate, part of the first insulation layer, and part of the channel layer are removed, and a recess region is formed in an outer side wall of the second insulation layer. A source-drain is formed in the recess region, and the source-drain is electrically connected with the channel layer.

In an alternative embodiment of the disclosure, the semiconductor substrate has a plurality of independent active regions. The active regions are isolated by a shallow groove isolation structure, and the groove is formed in each of the active regions.

In an alternative embodiment of the disclosure, the word line structure includes a conductive structure and a third insulation layer located on the conductive structure. The conductive structure includes a barrier layer and a first conductive layer.

In an alternative embodiment of the disclosure, the formation of the channel layer further includes at least forming a semiconductor layer on the inner wall of the first insulation layer; and doping the semiconductor layer to form the channel layer.

In an alternative embodiment of the disclosure, doping the semiconductor layer is performed by doping the semiconductor layer through ion implantation process.

In an alternative embodiment of the disclosure, the first insulation layer further covers a region above the semiconductor substrate. The channel layer further covers a surface of the first insulation layer located above the semiconductor substrate. The second insulation layer further covers a surface of the channel layer located above the semiconductor substrate. The operation of filling the groove with the word line structure further includes the following operations. The barrier layer is formed on a surface of the second insulation layer, and the barrier layer further covers the surface of the second insulation layer above the semiconductor substrate. A first conductive layer is formed on a surface of the barrier layer, and the groove is filled with the first conductive layer. The first conductive layer and the barrier layer are etched back to enable top surfaces of the first conductive layer and the barrier layer to locate lower than the top surface of the semiconductor substrate. Layers above the semiconductor substrate are removed with using the first insulation layer as an etching stop layer. A third insulation layer is formed, and the third insulation layer fills the groove and covers the region above the semiconductor substrate. Layers above the semiconductor substrate are removed with using the semiconductor substrate as an etching stop layer.

In an alternative embodiment of the disclosure, a material of the first insulation layer is different from a material of the third insulation layer.

In an alternative embodiment of the disclosure, the formation of the source-drain in the recess region further includes the following operations. The second conductive layer is deposited. The second conductive layer fills the recess region and covers the surface of the semiconductor substrate. The second conductive layer is etched, and the etching is stopped till the third insulation layer to form the source-drain.

In an alternative embodiment of the disclosure, the deposition of the second conductive layer further includes the following operations. A semiconductor layer is deposited. The semiconductor layer fills the recess region and covers the surface of the semiconductor substrate. The semiconductor layer is subjected with a plasma implantation or ion doping to enhance a conductivity of the semiconductor layer.

The disclosure further provides a semiconductor structure. The semiconductor structure includes a semiconductor substrate with a groove, a first insulation layer covering an inner wall of the groove, a channel layer covering an inner wall of the first insulation layer, a second insulation layer covering an inner wall of the channel layer, a word line structure filling in the groove, and a source-drain arranged at an outer side wall of the second insulation layer and electrically connected with the channel layer.

In an alternative embodiment of the disclosure, the semiconductor substrate has a plurality of independent active regions. The active regions are isolated by a shallow groove isolation structure. The groove is formed in each of the active regions.

In an alternative embodiment of the disclosure, a depth of the groove is 50 nm to 300 nm, and a width of the groove is 20 nm to 100 nm.

In an alternative embodiment of the disclosure, a thickness of the first insulation layer is 1 nm to 30 nm.

In an alternative embodiment of the disclosure, a thickness of the channel layer is 3 nm to 30 nm.

In an alternative embodiment of the disclosure, a top surface of the first insulation layer is located lower than a top surface of the channel layer. A top surface of the channel layer is located lower than a top surface of the second insulation layer.

In an alternative embodiment of the disclosure, an upper surface of the source-drain is flush with an upper surface of the word line structure.

In an alternative embodiment of the disclosure, the upper surface of the source-drain is flush with an upper surface of the shallow groove isolation structure.

The disclosure has the advantages that the channel layer is isolated from the semiconductor substrate by the first insulation layer, thereby avoiding generation of substrate leakage current and improving the reliability of the semiconductor structure.

REFERENCE SIGNS IN THE DRAWINGS

200: semiconductor substrate; 201: active region; 202: shallow groove isolation structure; 210: groove; 220: first insulation layer; 230: channel layer; 240: second insulation layer; 250: word line structure; 251: conductive structure; 251A: barrier layer; 251B: first conductive layer; 252: third insulation layer; 260: recess region; 270: source-drain;

300: hard mask layer; and

400: semiconductor layer.

DETAILED DESCRIPTION

Specific examples of a semiconductor structure and a method for preparing a semiconductor structure provided by the disclosure are described in detail below in combination with accompanying drawings.

With the continuous development of preparation process, the size of transistor has become smaller, and the intensity of channel electric field of the transistor has continued to be increased. As a process node of the DRAM reaches 20 nm or below, the problem of substrate leakage current of the transistor is becoming more and more serious, thereby causing the reliability problem in a device. For example, device snapback breakdown, the latch up effect of a complementary metal oxide semiconductor (CMOS) circuit, and reduction of the device life will occur.

Various embodiments of the present disclosure can address how to avoid the substrate leakage current.

Figure 1:
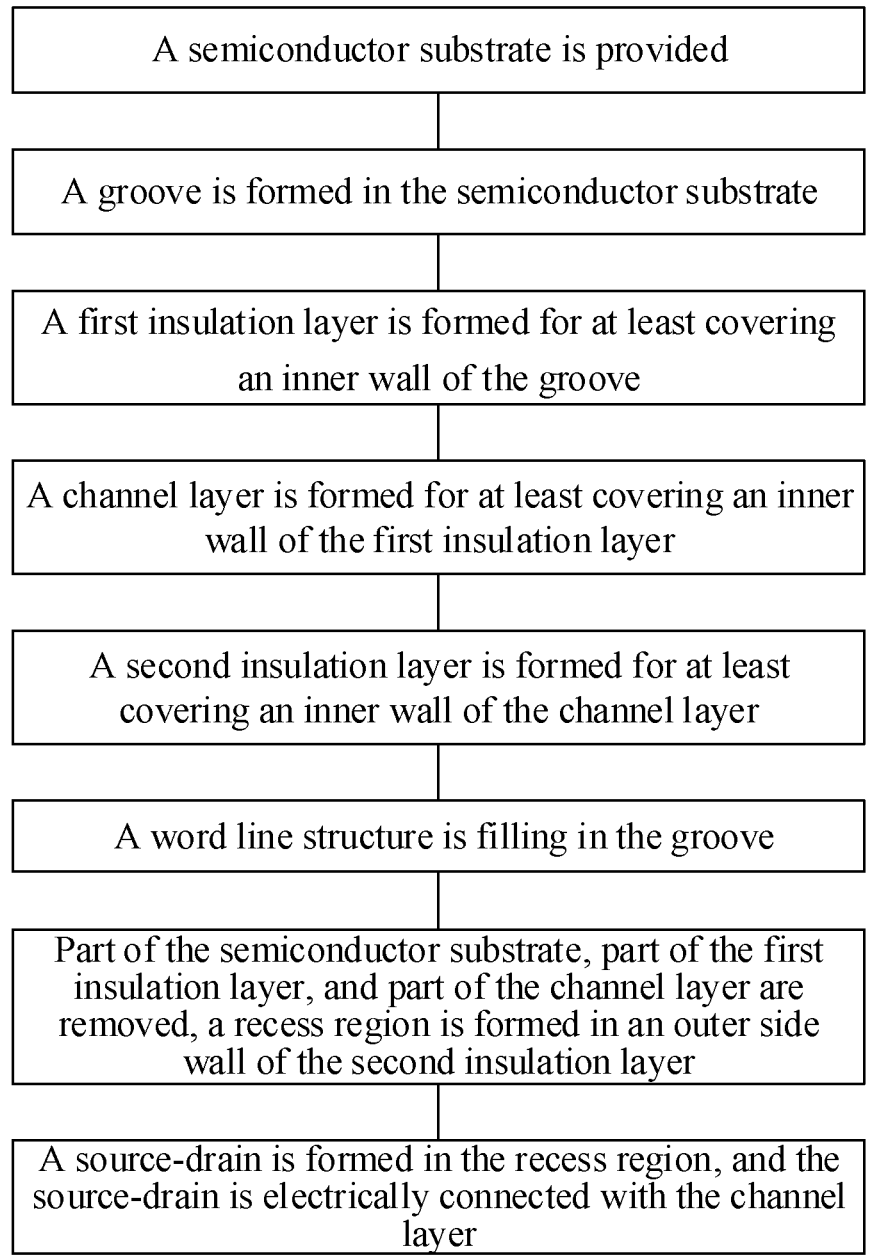
FIG. 1 schematically illustrates operations of a method for preparing a semiconductor structure according to one example of the disclosure.

FIG. 1 schematically illustrates operations of a method for preparing a semiconductor structure according to one example of the disclosure. Referring to FIG. 1, the method for preparing a semiconductor structure includes the following operations. A semiconductor substrate is provided. A groove is formed in the semiconductor substrate. A first insulation layer is formed, and the first insulation layer at least covers an inner wall of the groove. A channel layer is formed, and the channel layer at least covers an inner wall of the first insulation layer. A second insulation layer is formed, and the second insulation layer at least covers an inner wall of the channel layer. The groove is filled with a word line structure. Part of the semiconductor substrate, part of the first insulation layer, and part of the channel layer are removed, and a recess region is formed in an outer side wall of the second insulation layer. A source-drain is formed in the recess region, and the source-drain is electrically connected with the channel layer.

FIG. 2 to FIG. 14 respectively illustrate a flowchart of a method for preparing a semiconductor structure according to one example of the disclosure.

Figure 2:
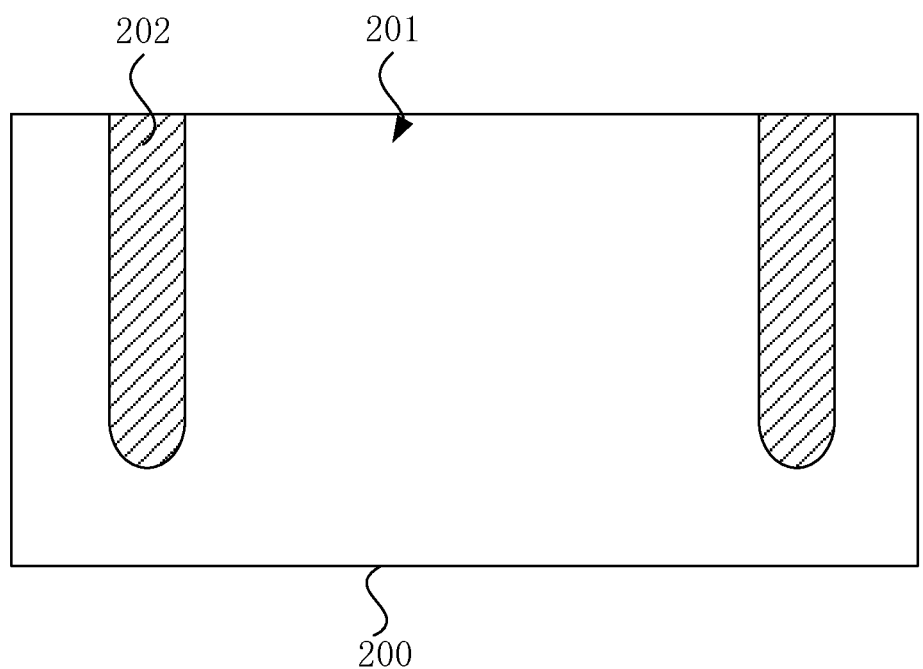
FIG. 2 illustrates a first flowchart of a method for preparing a semiconductor structure according to one example of the disclosure.

Referring to FIG. 2, a semiconductor substrate 200 is provided. The semiconductor substrate 200 may be made of at least one of material selected from Si, Ge, SiGe, SiC, SiGeC, InAs, GaAs, InP, or other III/V compound semiconductors. The semiconductor substrate may further include a multilayer structure composed of these semiconductors, or may be silicon on insulator (SOI), stacked SOI (SSOI), stacked silicon germanium on insulator (S—SiGeOI), silicon germanium on insulator (SiGeOI), germanium on insulator (GeOI) and the like. As an example, in this example, the semiconductor substrate 200 is made by monocrystalline silicon.

Further, in this example, the semiconductor substrate 200 has a plurality of independent active regions 201, and the active regions 201 are isolated by a shallow groove isolation structure 202. A material of the shallow groove isolation structure may be an oxide or other insulation materials.

Figure 3:
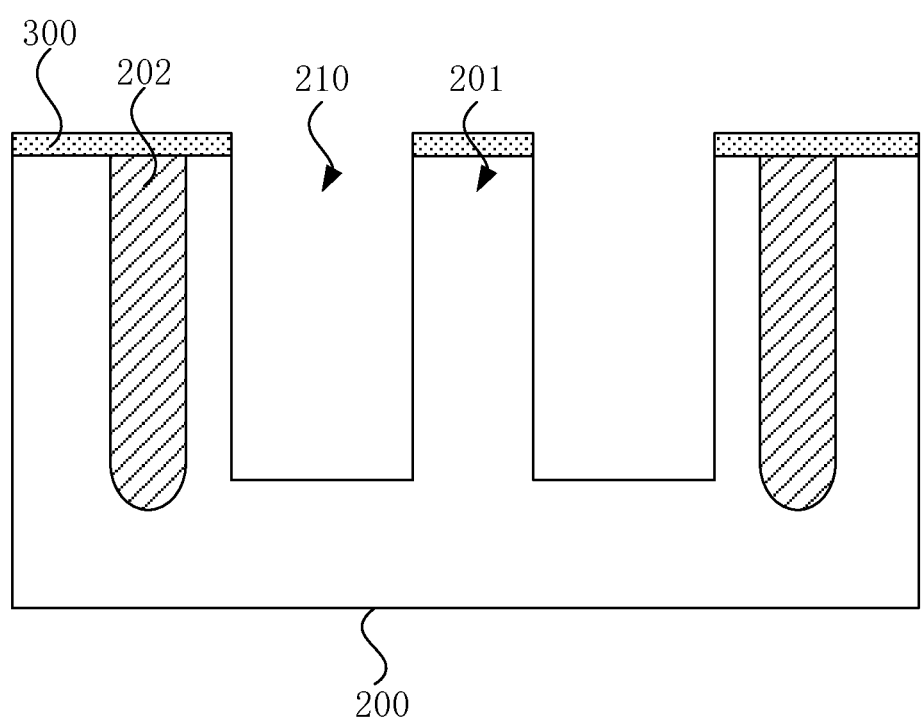
FIG. 3 illustrates a second flowchart of a method for preparing a semiconductor structure according to one example of the disclosure.

Referring to FIG. 3, a groove 210 is formed in the semiconductor substrate 200.

In this example, the groove 210 is formed in each of the active regions 201. As shown in FIG. 3, two grooves 210 are formed in one active region 201.

The formation of the groove may include the following operations. A patterned hard mask layer 300 is formed on the semiconductor substrate 200. A pattern of the hard mask layer 300 is transferred onto the semiconductor substrate 200 via a photoetching and etching process to form the groove 210. A depth of the groove 210 may be 50 nm to 300 nm, and a width thereof may be 20 nm to 100 nm, so as to provide a sufficient space for structures to be formed by subsequent processes. After this operation, the hard mask layer is not removed, so as to play a role of protecting the semiconductor substrate 200 in the subsequent processes.

Figure 4:
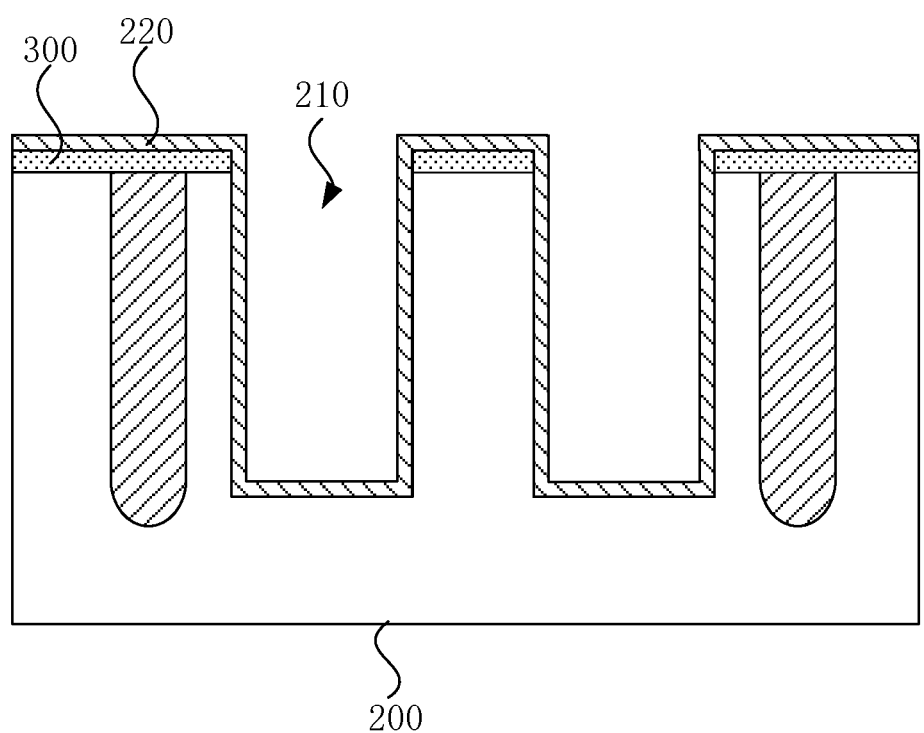
FIG. 4 illustrates a third flowchart of a method for preparing a semiconductor structure according to one example of the disclosure.

Referring to FIG. 4, a first insulation layer 220 is formed, and the first insulation layer 220 at least covers an inner wall of the groove 210. The first insulation layer 220 is formed by an atomic layer deposition (ALD). The first insulation layer 220 formed by this process is compact in structure and has high blocking effect. In this example, the first insulation layer 220 is made of a nitride, such as silicon nitride. In other example of the disclosure, the first insulation layer 220 may also be made of other insulation materials, such as an oxide. A thickness of the first insulation layer 220 is in range of 1 nm to 30 nm, so that the first insulation layer not only can achieve an effect of effectively blocking leakage current, but also can avoid excessive occupation of the space of the active regions 201 to affect the performance of a semiconductor device.

Further, the first insulation layer 220 not only covers the inner wall of the groove 210, and but also covers the surface of the semiconductor substrate 200. Specifically, in this example, a hard mask layer 300 is provided on the surface of the semiconductor substrate 200, so that the first insulation layer 220 not only covers the inner wall of the groove 210, but also covers the hard mask layer 300 on the surface of the semiconductor substrate 200.

Figure 5:
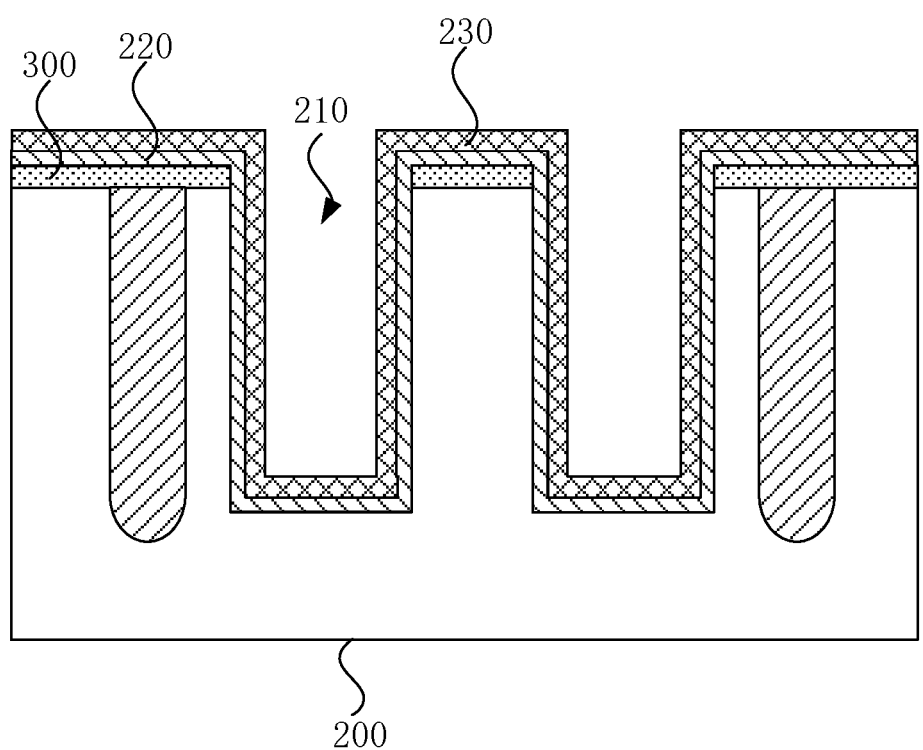
FIG. 5 illustrates a fourth flowchart of a method for preparing a semiconductor structure according to one example of the disclosure.

Referring to FIG. 5, a channel layer 230 is formed, and the channel layer 230 at least covers the inner wall of the first insulation layer 220. Further, the channel layer 230 not only covers the inner wall of the first insulation layer 220, but also covers the upper surface of the first insulation layer 220 above the semiconductor substrate 200.

The operation of forming the channel layer 230 is as follows.

At least a semiconductor layer is formed on the inner wall of the first insulation layer 220. In one example, the semiconductor layer not only covers the inner wall of the first insulation layer 220, but also covers the upper surface of the first insulation layer 220 above the semiconductor substrate 200. The semiconductor layer can be formed by low-pressure chemical vapor deposition (LPCVD), and can also be formed by LPCVD combined with an epitaxial process. The semiconductor layer includes, but is not limited to, a silicon structural layer, a germanium structural layer, or other structural layers.

The semiconductor layer is doped to form the channel layer 230. The operation of doping the semiconductor layer is performed by doping the semiconductor layer via the ion implantation process. Specifically, in this example, the semiconductor layer is doped with boron (B) via the ion implantation process to form the channel layer 230.

Further, after the channel layer 230 is formed, the channel layer 230 is subjected with the rapid thermal process (RTP) to repair lattice damages of the channel layer 230 and increase the carrier mobility of the channel layer 230, ensuring the performance of the semiconductor device.

Further, the thickness of the channel layer 230 is in range of 3 nm to 30 nm, so that the channel layer 230 can not only meet the requirements of the semiconductor device, but also avoid occupying the space of the active regions and affecting the formation of the word line structure in the follow-up.

Figure 6:
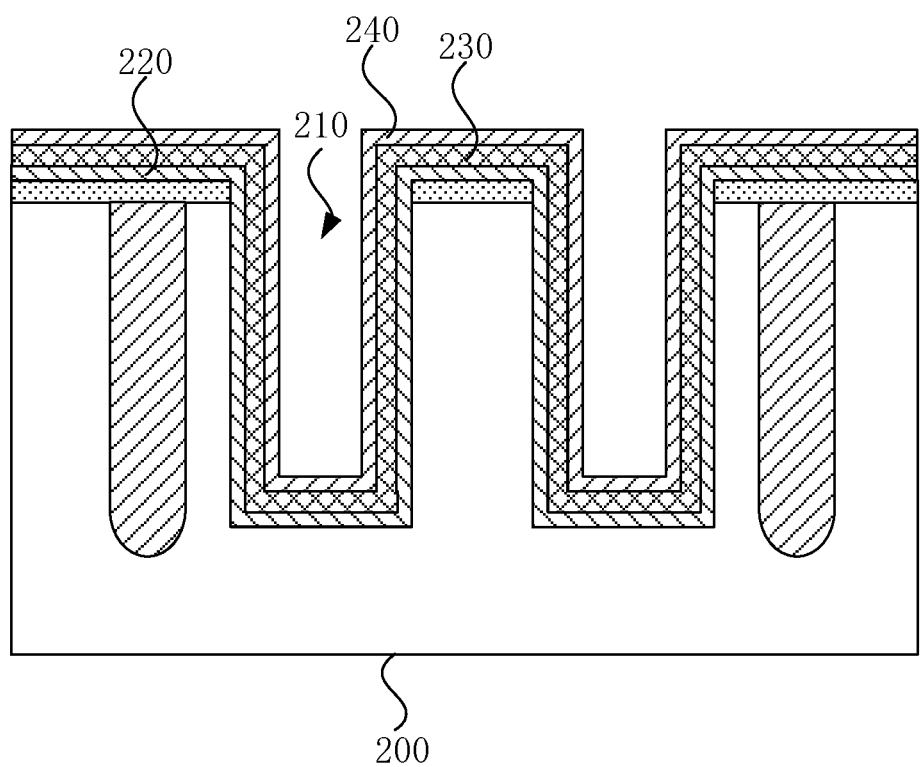
FIG. 6 illustrates a fifth flowchart of a method for preparing a semiconductor structure according to one example of the disclosure.

Referring to FIG. 6, a second insulation layer 240 is formed, and the second insulation layer 240 covers at least an inner wall of the channel layer 230. The second insulation layer 240 serves as an insulation layer between the subsequently formed word line structure and the channel layer. A thickness of the second insulation layer 240 may be in range of 15 to 40 angstroms. If it is too thin, the second insulation layer will not play the function of insulation between the word line structure and the channel layer. If it is too thick, the second insulation layer will increase the threshold voltage of the semiconductor device and affect the performance of the semiconductor device.

A material of the second insulation layer 240 may be an oxide or a high-K dielectric material. For example, the oxide may be silicon oxide, and the high-K dielectric material may be $HfO_2$, HfSiO, HfSiON, HfTaO, HfSiO, HfZrO, $Al_2O_3$, $La_2O_3$, $ZrO_2$, LaAlO or $Ta_2O_5$. Further, the material of the second insulation layer 240 is different from the material of the first insulation layer 220, so that in the subsequent process, the second insulation layer 240 and the first insulation layer 220 would have different etching rates under the same etching conditions, and thus can be selectively etched.

Further, in this example, the second insulation layer 240 not only covers the inner wall of the channel layer 230, but also covers the upper surface of the channel layer 230 above the semiconductor substrate 200.

Referring to FIG. 7 to FIG. 11, the groove 210 is filled with the word line structure 250. Each word line structure 250 includes a conductive structure 251 and a third insulation layer 252 located on the conductive structure 251. The conductive structure 251 includes a barrier layer 251A and a first conductive layer 251B. A material of the third insulation layer 252 is different from the material of the first insulation layer 220, so that in the subsequent etching process, the third insulation layer 252 and the first insulation layer 220 would have different etching rates under the same etching conditions, and thus can be selectively etched.

Specifically, in this example, the filling of the groove 210 with the word line structure 250 includes the following operations.

Figure 7:
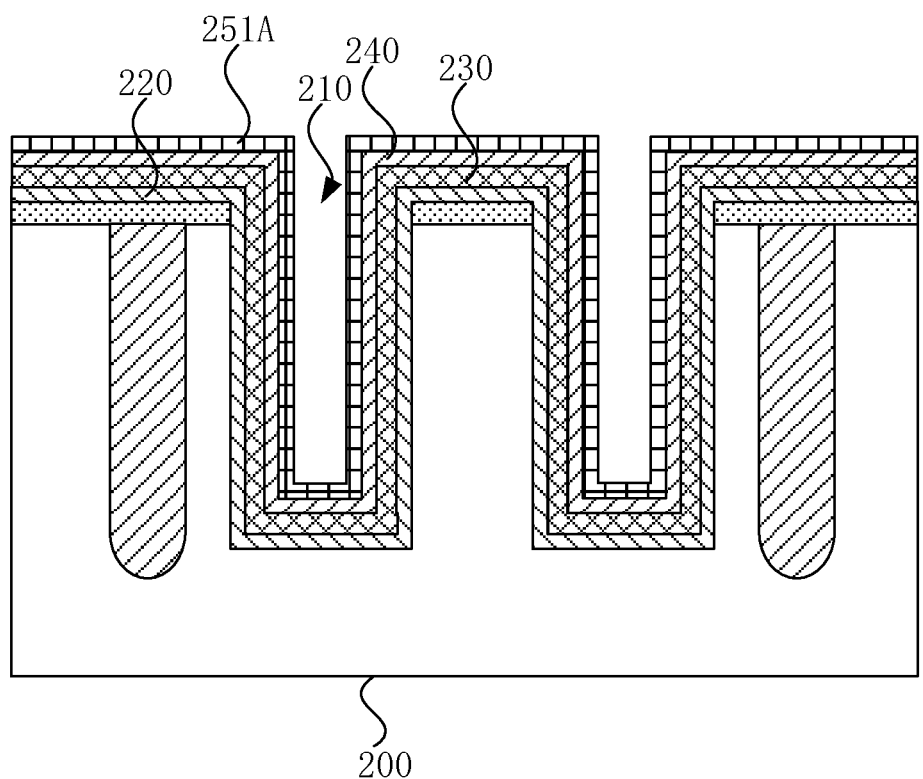
FIG. 7 illustrates a sixth flowchart of a method for preparing a semiconductor structure according to one example of the disclosure.

Referring to FIG. 7, a barrier layer 251A is formed on the surface of the second insulation layer 240, and the barrier layer 251A also covers an upper surface of the second insulation layer 240 above the semiconductor substrate 200. The barrier layer 251A may be TiN layer or a composite layer of Ti and TiN. A thickness of the barrier layer 251A may be in range of 2 to 7 nm.

Figure 8:
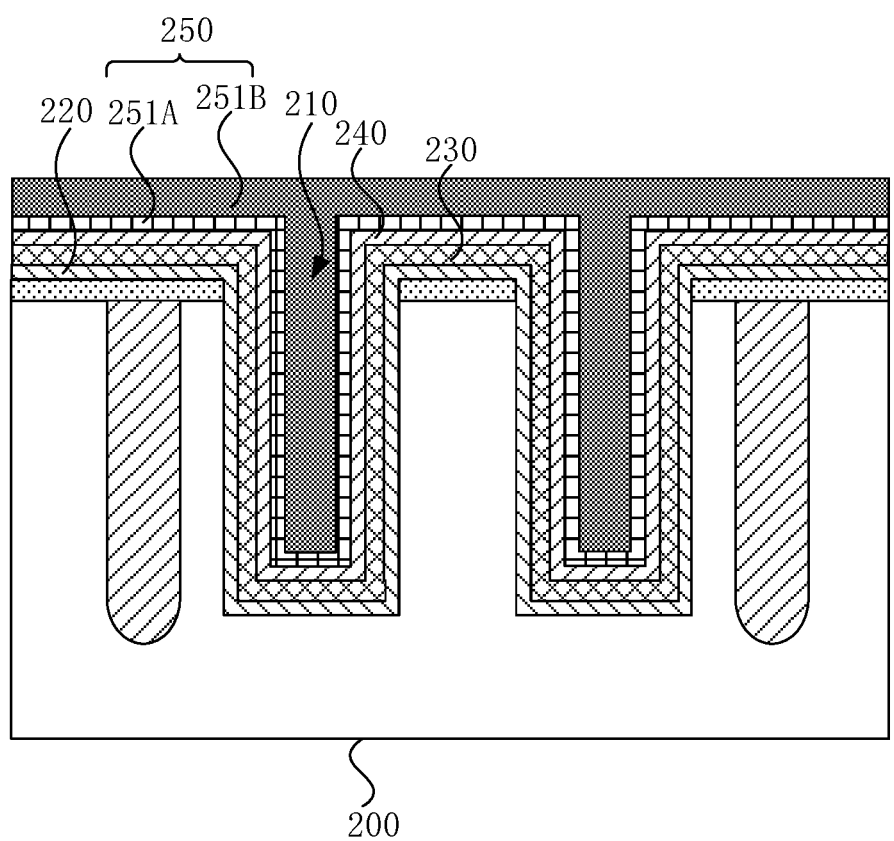
FIG. 8 illustrates a seven flowchart of a method for preparing a semiconductor structure according to one example of the disclosure.

Referring to FIG. 8, a first conductive layer 251B is formed on the barrier layer 251A, and the first conductive layer 251B fills the groove 210 and covers an upper surface of the barrier layer 251A above the semiconductor substrate 200. The first conductive layer 251B may be a metal tungsten layer. In the example, the first conductive layer 251B is formed by the CVD method, and a surface thereof is flattened via the chemical mechanical polishing. In other examples of the disclosure, other deposition processes, such as physical vapor deposition (PVD), may be used to form the first conductive layer 251B.

Figure 9:
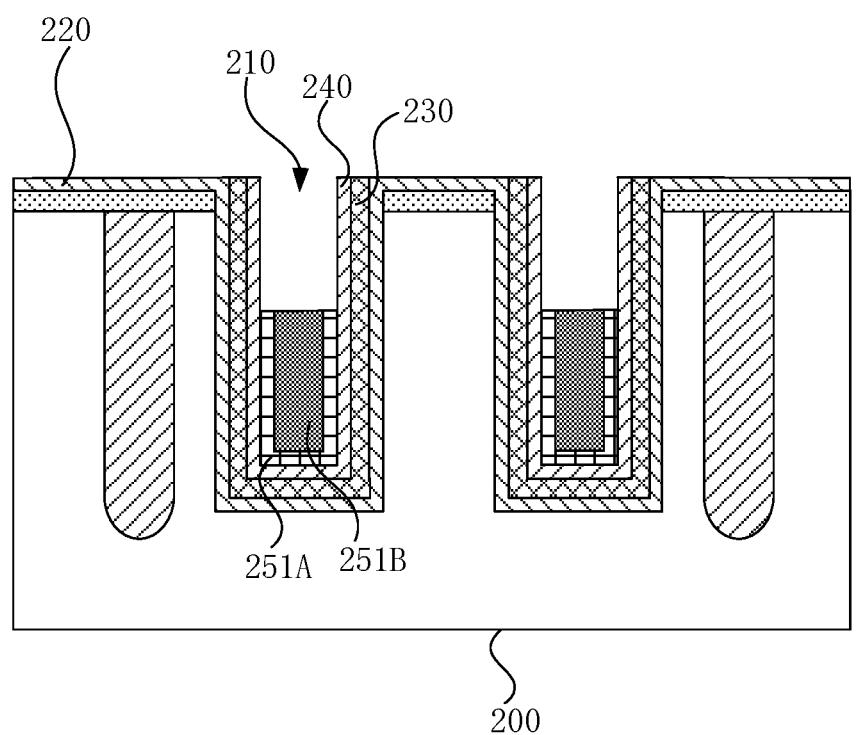
FIG. 9 illustrates an eighth flowchart of a method for preparing a semiconductor structure according to one example of the disclosure.

Referring to FIG. 9, the first conductive layer 251B and the barrier layer 251A are etched back by the dry etching, so that top surfaces of the first conductive layer 251B and the barrier layer 251A are located lower than a top surface of the semiconductor substrate 200. After this operation, part of the groove 210 is filled with the conductive structure 251, and part of a side wall of the second insulation layer 240 is exposed. A distance from an upper surface of the first conductive layer 251B to the top surface of the semiconductor substrate 200 may be in range of 20 nm to 150 nm.

Further, layers above the semiconductor substrate 200 are removed with using the first insulation layer 220 as an etching stop layer. Specifically, the first conductive layer 251B, the barrier layer 251A, the second insulation layer 240 and the channel layer 230 which are located above the semiconductor substrate 200 are removed, retaining the first insulation layer 220.

Further, a wet etching process is performed after the dry etching, so as to remove the barrier layer 251A remained on the side wall of the second insulation layer 240.

Figure 10:
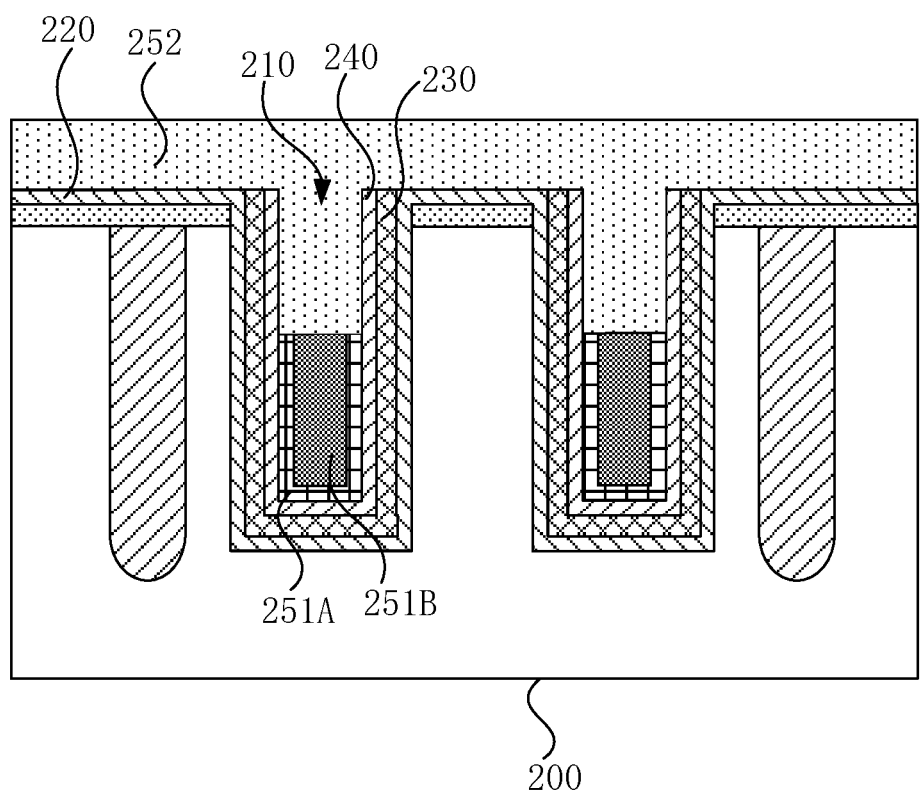
FIG. 10 illustrates a ninth flowchart of a method for preparing a semiconductor structure according to one example of the disclosure.

Referring to FIG. 10, a third insulation layer 252 is formed. The third insulation layer 252 fills the groove 210 and covers a region above the semiconductor substrate 200. Specifically, in the example, the third insulation layer 252 fills the groove 210 and covers the surface of the first insulation layer 220 located above the semiconductor substrate 200. A material of the third insulation layer 252 may be SiON.

Figure 11:
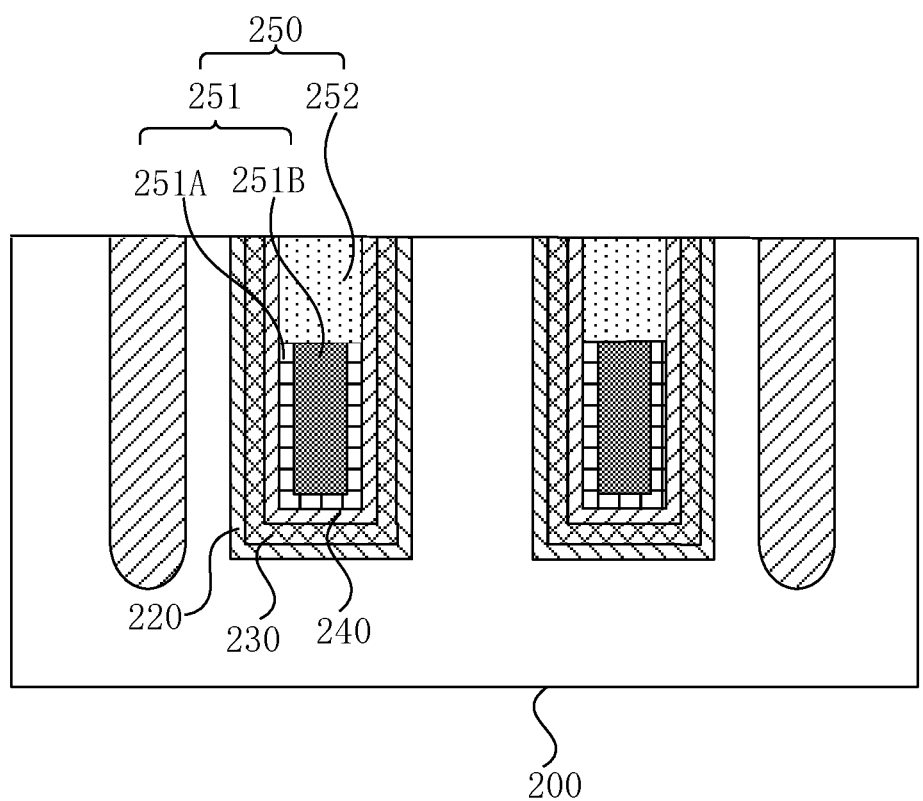
FIG. 11 illustrates a tenth flowchart of a method for preparing a semiconductor structure according to one example of the disclosure.

Referring to FIG. 11, film layers above the semiconductor substrate 200 is removed with using the semiconductor substrate 200 as an etching stop layer. In the present example, the third insulation layer 252, the first insulation layer 220, and the hard mask layer 300 located above the semiconductor substrate 200 are removed by the dry etching, to expose the semiconductor substrate 200. After this operation, top surfaces of the first insulation layer 220, the channel layer 230, the second insulation layer 240, and the third insulation layer 252 are flush with the top surface of the semiconductor substrate 200.

Figure 12:
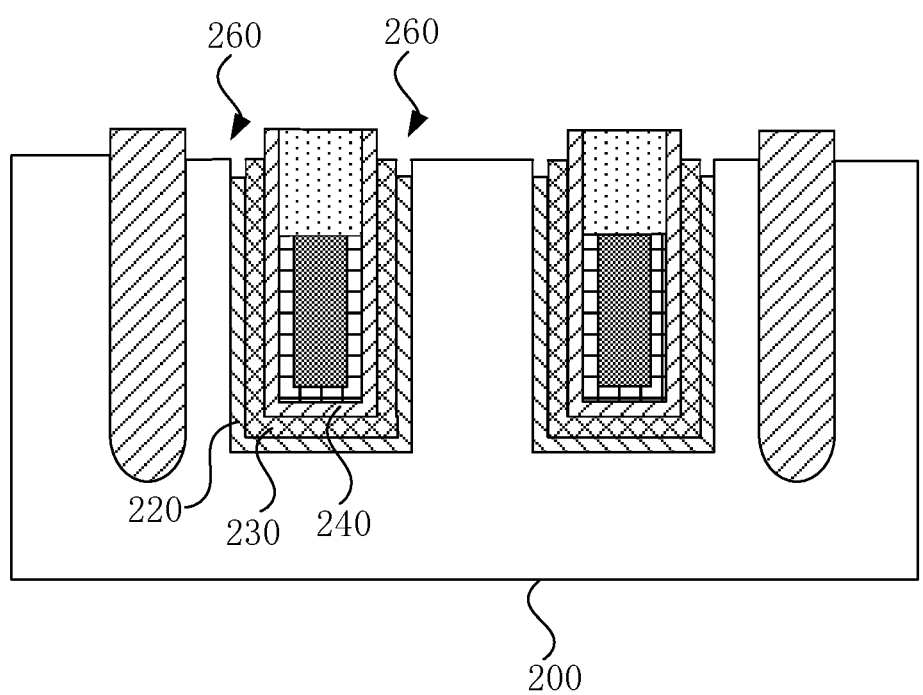
FIG. 12 illustrates an eleventh flowchart of a method for preparing a semiconductor structure according to one example of the disclosure.

Referring to FIG. 12, part of the semiconductor substrate 200, part of the first insulation layer 220 and part of the channel layer 230 are removed, and a recess region 260 is formed on an outer side wall of the second insulation layer 240. In this operation, the dry etching process is used for etching. The etching substance with smaller etching rate than that of the third insulation layer 252 or the second insulation layer 240 can be selected to be etched, to prevent the third insulation layer 252 and the second insulation layer 240 from being removed. In the present example, the etching rate of the first insulation layer 220 by the etching substance is greater than the etching rate of the semiconductor substrate 200 and the channel layer 230, and the etching rate of the semiconductor substrate 200 and the channel layer 230 is greater than the etching rate of the second insulation layer 240 and the third insulation layer 252, so that the sunken region 260 can be formed on the outer side wall of the second insulation layer 240.

For example, in one example, after the recess region is formed, an etching depth of the first insulation layer 220 is 10 to 80 nm, and an etching depth of the semiconductor substrate 200 or the channel layer 230 is 5 to 60 nm. A remaining thickness of the third insulation layer 252 is 50 to 80 nm.

Figure 13:
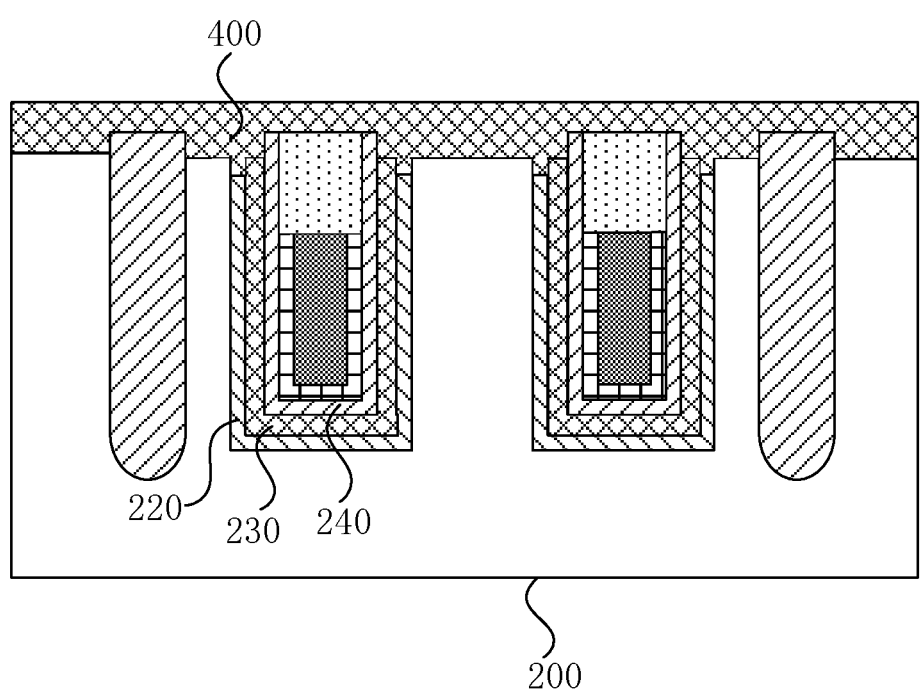
FIG. 13 illustrates a twelfth flowchart of a method for preparing a semiconductor structure according to one example of the disclosure.
Figure 14:
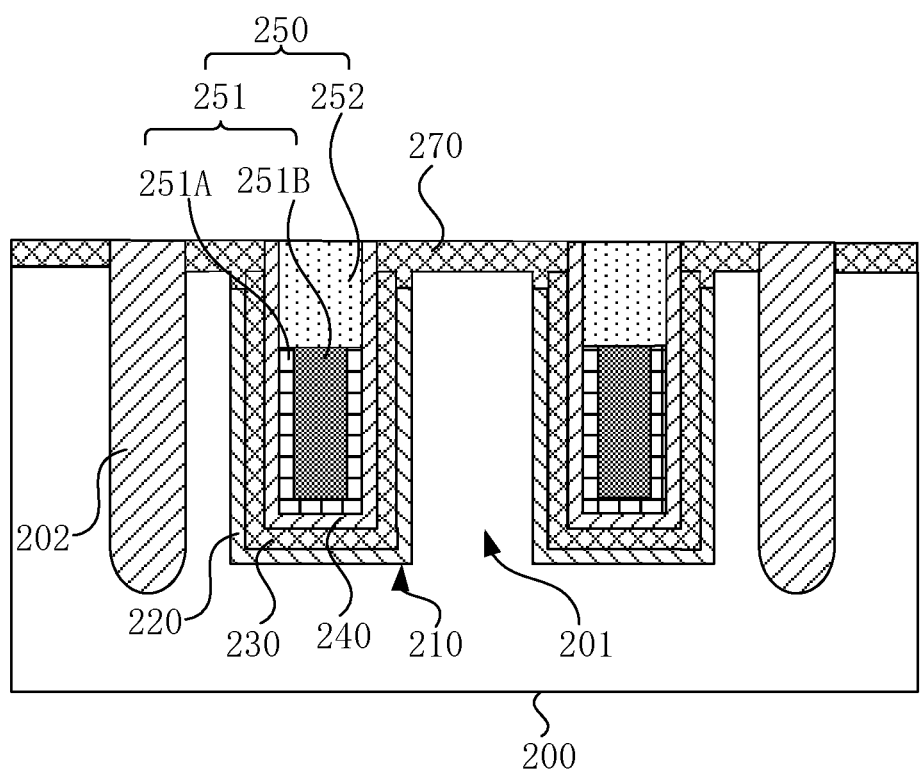
FIG. 14 illustrates a thirteenth flowchart of a method for preparing a semiconductor structure according to one example of the disclosure.

Referring to FIG. 13 and FIG. 14, a source-drain 270 is formed in the recess region 260, and the source-drain 270 is electrically connected with the channel layer 230. The source-drain 270 is made of a conductive material, and fills the recess region 260. A material of the source-drain 270 includes, but is not limited to, polycrystalline silicon.

Further, the formation of the source-drain 270 in the recess region 260 includes the following operations.

Referring to FIG. 13, a semiconductor layer 400 is deposited. The semiconductor layer 400 fills the recess region 260 and covers the surface of the semiconductor substrate 200. The semiconductor layer 400 may be deposited by the CVD process. A material of the semiconductor layer 400 includes, but is not limited to, polycrystalline silicon, germanium, and the like. In the present example, the material of the semiconductor layer 400 is polycrystalline silicon.

Further, after the semiconductor layer 400 is deposited, the semiconductor layer 400 is subjected with the plasma implantation or ion doping to enhance the conductivity of the semiconductor layer 400, forming a second conductive layer. In the plasma implantation, one or more of P ion and As ion may be used.

Further, the second conductive layer may be annealed to repair lattice damages and improve performances of the device.

Further, after the doping, the second conductive layer is flattened to make its surface flat. The flattening may be achieved by chemical mechanical polishing (CMP).

Referring to FIG. 14, the second conductive layer is etched, and the etching is stopped till the third insulation layer 252 to form the source-drain 270. In this operation, only the second conductive layer located in the recess region 260 is remained as the source-drain 270.

In the semiconductor structure formed by the method for preparing the semiconductor structure of the present disclosure, the second conductive layer remained is used as the source-drain 270 of a transistor, the word line structure 250 is used as the gate of the transistor, and the second insulation layer 240 is used as the gate insulation layer. The channel layer 230 is isolated from the semiconductor substrate 200 by the first insulation layer 220, thereby avoiding generation of substrate leakage current and improving the reliability of the semiconductor structure.

The present disclosure also provides a semiconductor structure prepared by the above method. Referring to FIG. 14, in one example of the semiconductor structure of the present disclosure, the semiconductor structure includes a semiconductor substrate 200, a first insulation layer 220, a channel layer 230, a second insulation layer 240, a word line structure 250, and a source-drain 270.

The semiconductor substrate 200 has a groove 210. In this example, the semiconductor substrate 200 has a plurality of independent active regions 201. The active regions 201 are isolated by a shallow groove isolation structure 202; and the groove 210 is formed in each of the active regions 201. A depth of the groove 210 is 50 to 300 nm, and a width thereof is 20 to 100 nm, so as to provide a sufficient space for semiconductor structures formed in the groove 210. The semiconductor substrate 200 includes a plurality of the grooves 210. For example, as shown in FIG. 14, two grooves 210 are formed in one active region 201.

The first insulation layer 220 covers the inner wall of the groove 210. In this example, the first insulation layer 220 is made of a nitride, such as silicon nitride. In other examples of the disclosure, the first insulation layer 220 may also be made of other insulation materials, such as an oxide. A thickness of the first insulation layer 220 is in range of 1 nm to 30 nm, so that the first insulation layer can achieve an effect of effectively blocking leakage current and can avoid excessive occupation of the space of the active region 201 to affect the performance of a semiconductor device.

The channel layer 230 covers the inner wall of the first insulation layer 220. The channel layer 230 may be made of a boron-doped silicon material. A thickness of the channel layer 230 is in range of 3 nm to 30 nm, so that the channel layer 230 can not only meet the requirements of the semiconductor device, but also avoid occupying the space of the active regions and affecting the formation of the word line structure in the follow-up.

The second insulation layer 240 covers the inner wall of the channel layer 230. The second insulation layer 240 serves as an insulation layer between the word line structure 250 and the channel layer 230. A thickness of the second insulation layer 240 may be 15 to 40 angstroms. If it is too thin, the second insulation layer will not play the function of insulation between the word line structures and the channel layer. If it is too thick, the second insulation layer will increase the threshold voltage of the semiconductor device and affect the performance of the semiconductor device.

A material of the second insulation layer 240 may be an oxide or a high-K dielectric material. For example, the oxide may be silicon oxide, and the high-K dielectric material may be $HfO_2$, HfSiO, HfSiON, HfTaO, HfSiO, HfZrO, $Al_2O_3$, $La_2O_3$, $ZrO_2$, LaAlO or $Ta_2O_5$. Further, the material of the second insulation layer 240 is different from the material of the first insulation layer 220, so that in the subsequent process, the second insulation layer 240 and the first insulation layer 220 would have different etching rates under the same etching conditions, and thus can be selectively etched.

The word line structure 250 fills within the groove 210. Each word line structure 250 includes a conductive structure 251 and a third insulation layer 252 located on the conductive structure 251. The conductive structure 251 includes a barrier layer 251A and a first conductive layer 251B. The barrier layer 251A may be TiN layer or a composite layer of Ti and TiN. A thickness of the barrier layer 251A may be 2 to 7 nm. The first conductive layer 251B may be a metal tungsten layer. The top surfaces of the first conductive layer 251B and the barrier layer 251A are located lower than the top surface of the semiconductor substrate 200. A distance from the first conductive layer 251B to the top surface of the semiconductor substrate 200 may be in range of 20 to 150 nm.

A material of the third insulation layer 252 may be SiON. The material of the third insulation layer 252 is different from the material of the first insulation layer 220, so that in the etching process, the third insulation layer 252 and the first insulation layer 220 would have different etching rates under the same etching conditions, and thus can be selectively etched.

The source-drain 270 is arranged on the outer side wall of the second insulation layer 240 and is electrically connected with the channel layer 230. The source-drain 270 is composed of a conductive material which includes, but is not limited to, polycrystalline silicon.

Further, the top surface of the first insulation layer 220 is located lower than the top surface of the channel layer 230 to enlarge a contact area between the source-drain 270 and the channel layer 230. The top surface of the channel layer 230 is located lower than the top surface of the second insulation layer 240 to avoid contact between the word line structure 250 and the channel layer 230.

The word line structure 250, the source-drain 270 and the channel layer 230 constitutes a transistor. The word line structure 250 is used as the gate of the transistor, and the second insulation layer 240 is used as a gate insulation layer. The first insulation layer 220 isolates the channel layer 230 from the semiconductor substrate 200, thereby avoiding generation of substrate leakage current, and improving the reliability of the semiconductor structure.

The above descriptions are only the optional implementation modes of the present disclosure. It should be noted that those of ordinary skill in the art can further make several improvements and retouches without departing from the principles of the present application. These improvements and retouches shall also all fall within the protection scope of the present application.

What is claimed is:

1. A method for preparing a semiconductor structure, comprising:
   providing a semiconductor substrate;
   forming a groove in the semiconductor substrate;
   forming a first insulation layer, the first insulation layer at least covering an inner wall of the groove;
   forming a channel layer, the channel layer at least covering an inner wall of the first insulation layer;
   forming a second insulation layer, the second insulation layer at least covering an inner wall of the channel layer;
   filling the groove with a word line structure;
   removing part of the semiconductor substrate, part of the first insulation layer, and part of the channel layer, and forming a recess region in an outer side wall of the second insulation layer; and
   forming a source-drain in the recess region, the source-drain being electrically connected with the channel layer.

2. The method for preparing the semiconductor structure according to claim 1, wherein the semiconductor substrate has a plurality of independent active regions; the active regions are isolated by a shallow groove isolation structure; and
   the groove is formed in each of the active regions.

3. The method for preparing the semiconductor structure according to claim 1, wherein the word line structure comprises a conductive structure and a third insulation layer located on the conductive structure; and the conductive structure comprises a barrier layer and a first conductive layer.

4. The method for preparing the semiconductor structure according to claim 1, wherein the formation of the channel layer further comprises:
   at least forming a semiconductor layer on the inner wall of the first insulation layer; and
   doping the semiconductor layer to form the channel layer.

5. The method for preparing the semiconductor structure according to claim 4, wherein doping the semiconductor layer is performed by doping the semiconductor layer through an ion implantation process.

6. The method for preparing the semiconductor structure according to claim 3, wherein the first insulation layer further covers a region above the semiconductor substrate; the channel layer further covers a surface of the first insulation layer located above the semiconductor substrate; the second insulation layer further covers a surface of the channel layer located above the semiconductor substrate;
   the filling of the groove the with word line structure further comprises:
   forming the barrier layer on a surface of the second insulation layer, the barrier layer further covering the surface of the second insulation layer above the semiconductor substrate;
   forming a first conductive layer on a surface of the barrier layer, the first conductive layer filling in the groove;
   etching back the first conductive layer and the barrier layer to enable top surfaces of the first conductive layer and the barrier layer to locate lower than a top surface of the semiconductor substrate, and removing layers above the semiconductor substrate with using the first insulation layer as an etching stop layer;

forming a third insulation layer, the third insulation layer filling in the groove and covering the region above the semiconductor substrate; and removing layers above the semiconductor substrate with using the semiconductor substrate as an etching stop layer.

7. The method for preparing the semiconductor structure according to claim 3, wherein a material of the first insulation layer is different from a material of the third insulation layer.

8. The method for preparing the semiconductor structure according to claim 3, wherein the formation of the source-drain in the recess region further comprises:

depositing a second conductive layer, the second conductive layer filling in the recess region and covering a surface of the semiconductor substrate;

etching the second conductive layer, and stopping the etching till the third insulation layer to form the source-drain.

9. The method for preparing the semiconductor structure according to claim 8, wherein the deposition of the second conductive further comprises:

depositing a semiconductor layer, the semiconductor layer filling in the recess region and covering the surface of the semiconductor substrate; and subjecting the semiconductor layer with plasma implantation or ion doping to enhance a conductivity of the semiconductor layer.

10. A semiconductor structure, comprising:
a semiconductor substrate having a groove;
a first insulation layer covering an inner wall of the groove;
a channel layer covering an inner wall of the first insulation layer;
a second insulation layer covering an inner wall of the channel layer;
a word line structure filling in the groove;
a recess region arranged on an outer side wall of the second insulation layer, the recess region is formed by removing part of the semiconductor substrate, part of the first insulation layer, and part of the channel layer and
a source-drain filling in the recess region and electrically connected with the channel layer.

11. The semiconductor structure according to claim 10, wherein the semiconductor substrate has a plurality of independent active regions; the active regions are isolated by a shallow groove isolation structure; and the groove is formed in each of the active regions.

12. The semiconductor structure according to claim 10, wherein a depth of the groove is 50 to 300 nm, and a width of the groove is 20 to 100 nm.

13. The semiconductor structure according to claim 10, wherein a thickness of the first insulation layer is 1 to 30 nm.

14. The semiconductor structure according to claim 10, wherein a thickness of the channel layer is 3 to 30 nm.

15. The semiconductor structure according to claim 10, wherein a top surface of the first insulation layer is located lower than a top surface of the channel layer; and the top surface of the channel layer is located lower than a top surface of the second insulation layer.

16. The semiconductor structure according to claim 10, wherein an upper surface of the source-drain is flush with the upper surface of the word line structure.

17. The semiconductor structure according to claim 11, wherein the upper surface of the source-drain is flush with an upper surface of the shallow groove isolation structure.

* * * * *